(12) United States Patent
Joo et al.

(10) Patent No.: US 11,211,432 B2
(45) Date of Patent: Dec. 28, 2021

(54) LIGHT EMITTING DEVICE AND DISPLAY APPARATUS INCLUDING THE LIGHT EMITTING DEVICE

(71) Applicant: SAMSUNG ELECTRONICS CO., LTD., Suwon-si (KR)

(72) Inventors: Wonjae Joo, Seongnam-si (KR); Jisoo Kyoung, Seoul (KR); Youngnam Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/812,558

(22) Filed: Mar. 9, 2020

(65) Prior Publication Data

US 2020/0403037 A1 Dec. 24, 2020

(30) Foreign Application Priority Data

Jun. 19, 2019 (KR) .................. 10-2019-0073149

(51) Int. Cl.
*H01L 27/32* (2006.01)
*H01L 51/50* (2006.01)
*H01L 51/52* (2006.01)

(52) U.S. Cl.
CPC ........ *H01L 27/322* (2013.01); *H01L 27/3218* (2013.01); *H01L 51/502* (2013.01); *H01L 51/5218* (2013.01); *H01L 51/5271* (2013.01); *H01L 2251/5376* (2013.01)

(58) Field of Classification Search
CPC .. H01L 27/322; H01L 27/3218; H01L 51/502
See application file for complete search history.

(56) References Cited

U.S. PATENT DOCUMENTS

| 9,231,169 | B2 | 1/2016 | Im et al. |
| 10,903,454 | B2 * | 1/2021 | Joo ................... H01L 51/5262 |
| 2006/0152151 | A1 | 7/2006 | Seo |
| 2007/0085086 | A1 | 4/2007 | Gohara et al. |

(Continued)

FOREIGN PATENT DOCUMENTS

| EP | 3355357 A1 | 8/2018 |
| JP | 2006-269421 A | 10/2006 |

(Continued)

OTHER PUBLICATIONS

Communication from EPO in Application No. 20174144.4 dated Nov. 12, 2020.

(Continued)

*Primary Examiner* — Anthony Ho
(74) *Attorney, Agent, or Firm* — Sughrue Mion, PLLC

(57) ABSTRACT

Provided a light emitting device including a first metal reflection layer including a phase modulation surface configured to magnetically resonate incident light, a color conversion layer provided on the phase modulation surface of the first metal reflection layer and including a photoluminescent material, a first electrode provided on the color conversion layer opposite to the first metal reflection layer, a white organic light emitting layer provided on the first electrode opposite to the color conversion layer, and a second electrode provided on the white organic light emitting layer opposite to the first electrode.

35 Claims, 16 Drawing Sheets

(56) References Cited

U.S. PATENT DOCUMENTS

| | | |
|---|---|---|
| 2008/0090317 A1 | 4/2008 | Hsu et al. |
| 2010/0141612 A1 | 6/2010 | Desieres et al. |
| 2011/0101386 A1 | 5/2011 | Fukuda |
| 2014/0183460 A1 | 7/2014 | Kim et al. |
| 2016/0043286 A1 | 2/2016 | Zehetner et al. |
| 2018/0097202 A1 | 4/2018 | Forrest et al. |
| 2021/0159460 A1* | 5/2021 | Joo ...................... H01L 51/502 |

FOREIGN PATENT DOCUMENTS

| | | |
|---|---|---|
| JP | 2007-115419 A | 5/2007 |
| KR | 10-2014-0078977 A | 6/2014 |

OTHER PUBLICATIONS

Park, Yeonsang et al., "Metasurface electrode light emitting diodes with planar light control", Scientific Reports, vol. 7, Nov. 7, 2017. (7 pages total).

\* cited by examiner

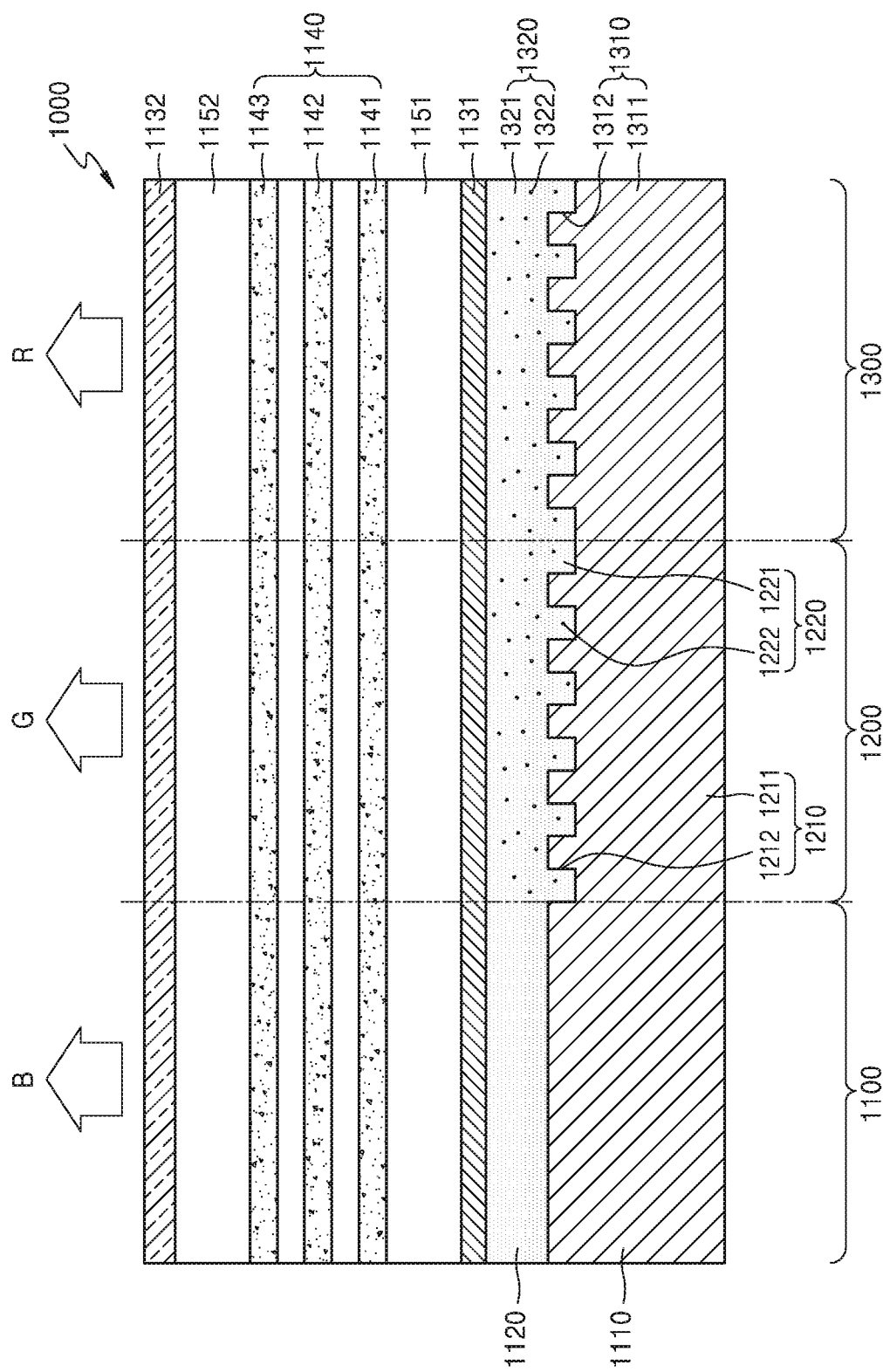

LIGHT EMITTING DEVICE AND DISPLAY APPARATUS INCLUDING THE LIGHT EMITTING DEVICE

CROSS-REFERENCE TO RELATED APPLICATION

This application claims priority to Korean Patent Application No. 10-2019-0073149, filed on Jun. 19, 2019, in the Korean Intellectual Property Office, the disclosure of which is incorporated herein in its entirety by reference.

BACKGROUND

1. Field

Example embodiments of the present disclosure relate to a light emitting device and a display apparatus including the light emitting device.

2. Description of the Related Art

Organic light emitting devices (OLEDs) are configured to emit light having a specific color as holes supplied from an anode and electrons supplied from a cathode combine with each other in an organic light emitting layer. Display apparatuses using such OLEDs may have characteristics such as a wide viewing angle, a high response speed, a small thickness, low manufacturing costs, and high contrast. Recently, OLEDs and display apparatuses that are configured to emit light having desired colors by using a microcavity effect have been developed.

SUMMARY

One or more example embodiments provide a light emitting device and a display apparatus including the light emitting device.

According to an aspect of an example embodiment, there is provided a light emitting device including a first metal reflection layer including a phase modulation surface configured to magnetically resonate incident light, a color conversion layer provided on the phase modulation surface of the first metal reflection layer and including a photoluminescent material, a first electrode provided on the color conversion layer opposite to the first metal reflection layer, a white organic light emitting layer provided on the first electrode opposite to the color conversion layer, and a second electrode provided on the white organic light emitting layer opposite to the first electrode.

The first metal reflection layer and the second electrode may form a microcavity having a resonance wavelength.

The phase modulation surface may include a meta structure in which nanopatterns are periodically provided.

The color conversion layer may further include a dielectric, the photoluminescent material being dispersed in the dielectric.

The photoluminescent material may include a green photoluminescent material configured to convert blue light into green light or a red photoluminescent material configured to convert blue light and green light respectively into red light.

The color conversion layer may cover the phase modulation surface of the first metal reflection layer.

The light emitting device may further include a transparent planarization layer provided between the first metal reflection layer and the color conversion layer and covering the phase modulation surface of the first metal reflection layer.

The first electrode may include a transparent electrode, and the second electrode may include a translucent electrode configured to transmit a portion of light incident on the second electrode and reflect a remaining portion of the light incident on the second electrode.

The first electrode may include a transparent electrode and the second electrode may include a reflective electrode, and the first metal reflection layer may be a translucent layer configured to transmit a portion of light incident on the first metal reflection layer and reflect a remaining portion of the light incident on the first metal reflection layer.

The light emitting device may further include a second metal reflection layer provided on the second electrode and including a phase modulation surface, and a planarization layer provided between the second electrode and the second metal reflection layer and covering the phase modulation surface of the second metal reflection layer.

The first metal reflection layer and the second metal reflection layer may form a microcavity having a resonance wavelength.

The first electrode and the second electrode may respectively include a transparent electrode, and one of the first metal reflection layer and the second metal reflection layer may be configured to reflect light, and the other of the first reflection layer and the second metal reflection layer may be translucent and configured to transmit a portion of light and reflect a remaining portion of the light.

According to another aspect of an example embodiment, there is provided a display apparatus including a plurality of pixels configured to emit light having a plurality of colors, wherein at least one of the plurality of pixels includes a first metal reflection layer including a phase modulation surface configured to magnetically resonate light incident on the first metal reflection layer, a color conversion layer provided on the phase modulation surface of the first metal reflection layer and including a photoluminescent material, a first electrode provided on the color conversion layer opposite to the first metal reflection layer, a white organic light emitting layer provided on the first electrode opposite to the color conversion layer, and a second electrode provided on the white organic light emitting layer opposite to the first electrode.

The phase modulation surface may include a meta structure in which nanopatterns are periodically provided.

The color conversion layer may further include a dielectric, the photoluminescent material being dispersed in the dielectric.

The color conversion layer may cover the phase modulation surface of the first metal reflection layer.

The at least one of the plurality of pixels may further include a transparent planarization layer provided between the first metal reflection layer and the color conversion layer and covering the phase modulation surface of the first metal reflection layer.

The at least one of the plurality of pixels further includes a second metal reflection layer provided on the second electrode and including a phase modulation surface, and a planarization layer provided between the second electrode and the second metal reflection layer and covering the phase modulation surface of the second metal reflection layer.

The plurality of pixels may include a blue pixel, a green pixel, and a red pixel.

A photoluminescent material included in the green pixel may include a green photoluminescent material configured to convert blue light into green light, and a photoluminescent material included in the red pixel may include a red photoluminescent material configured to convert blue light and green light respectively into red light.

According to another aspect of an example embodiment, there is provided a light emitting device including a first electrode, a second electrode, a light emitting layer provided between the first electrode and the second electrode, and configured to emit white light, a metal reflection layer provided on the first electrode opposite to the light emitting layer, the metal reflection layer including a phase modulation surface configured to resonate a specific wavelength of the white light emitted from the light emitting layer, and a color conversion layer provided between the first electrode and the metal reflection layer, and configured to convert a portion of the white light into light having the specific wavelength.

The metal reflection layer may include at least one of silver (Ag), aluminum (Al), and gold (Au).

The phase modulation surface may include a meta structure in which nanopatterns are periodically provided.

Each of the nanopatterns may have a cylinder shape or polyprism shape.

Each of the nanopatterns may have a width of 50 nm to 300 nm.

The nanopatterns may be provided at a pitch of 100 nm to 400 nm, the pitch being a distance between adjacent nanopatterns.

The color conversion layer may include a dielectric, a photoluminescent material being dispersed in the dielectric.

The photoluminescent material may include at least one of quantum dots, organic fluorescent dyes, organic fluorescent semiconductors, and organic phosphorescent semiconductors.

The photoluminescent material may include a green photoluminescent material configured to convert blue light into green light or a red photoluminescent material configured to convert blue light and green light respectively into red light.

The color conversion layer may cover the phase modulation surface of the metal reflection layer.

The light emitting device may further include a transparent planarization layer provided between the metal reflection layer and the color conversion layer and covering the phase modulation surface of the metal reflection layer.

The first electrode may be a transparent electrode, and the second electrode may be a translucent electrode configured to transmit a portion of light incident on the second electrode and reflect a remaining portion of the light incident on the second electrode.

The first electrode may be a transparent electrode and the second electrode may be a reflective electrode, and the metal reflection layer may be a translucent layer configured to transmit a portion of light incident on the metal reflection layer and reflect a remaining portion of the light incident on the metal reflection layer.

According to another aspect of an example embodiment, there is provided a light emitting device including a metal reflection layer including a phase modulation surface configured to magnetically resonate incident light, the phase modulation surface including a plurality of nanopatterns, a color conversion layer provided on the phase modulation surface of the first metal reflection layer, the color conversion layer including a dielectric and a photoluminescent material, a first electrode provided on the color conversion layer opposite to the first metal reflection layer, a white organic light emitting layer provided on the first electrode opposite to the color conversion layer, and a second electrode provided on the white organic light emitting layer opposite to the first electrode.

The color conversion layer may cover the phase modulation surface of the metal reflection layer.

BRIEF DESCRIPTION OF THE DRAWINGS

The above and/or other aspects, features, and advantages of example embodiments of the disclosure will be more apparent from the following description taken in conjunction with the accompanying drawings, in which:

FIG. 14 is a view illustrating a display apparatus according to an example embodiment.

DETAILED DESCRIPTION

Figure 1:
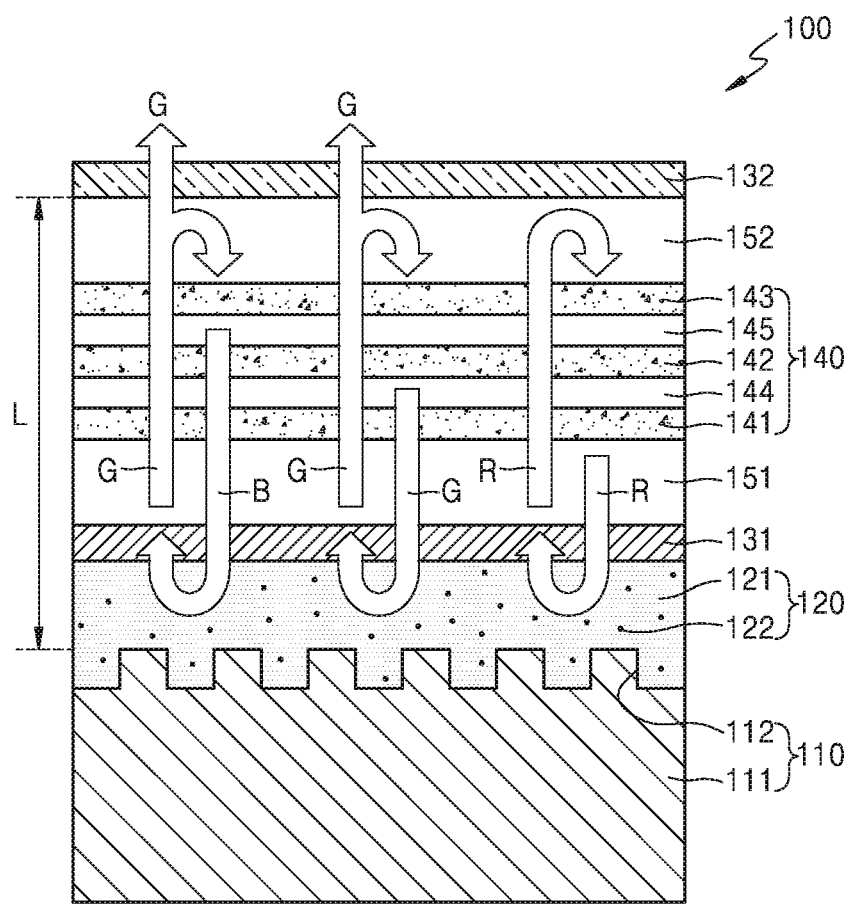
FIG. 1 is a cross-sectional view illustrating a light emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the "definite article" or a demonstrative pronoun may be construed as the element or the elements even though it has a singular form. Operations of a method may be performed in appropriate order unless explicitly described in terms of order or described to the contrary. That is, operations are not limited to the order in which the operations are described. Examples or exemplary terms are just used herein to describe technical ideas and should not be considered for purposes of limitation unless defined by the claims.

Light emitting devices described in the following example embodiments may be organic light emitting devices (OLEDs) that emit light having given wavelengths to the outside.

FIG. 1 is a cross-sectional view illustrating a light emitting device 100 according to an example embodiment.

Referring to FIG. 1, the light emitting device 100 includes a metal reflection layer 110 including a phase modulation surface, a color conversion layer 120 provided on the phase modulation surface of the metal reflection layer 110 and including a photoluminescent material 122, a first electrode 131 provided on the color conversion layer 120, a white organic light emitting layer 140 provided above the first electrode 131, and a second electrode 132 provided above the white organic light emitting layer 140.

The first electrode 131 may serve as an anode that provides holes to the white organic light emitting layer 140, and the second electrode 132 may serve as a cathode that provides electrons to the white organic light emitting layer 140. To this end, the first electrode 131 may include a material having a relatively high work function, and the second electrode 132 may include a material having a relatively low work function.

The first electrode 131 may include a transparent electrode configured to transmit light. For example, the first electrode 131 may include a transparent conductive oxide such as indium tin oxide (ITO), indium zinc oxide (IZO), or aluminum zinc oxide (AZO).

The second electrode 132 may include a translucent electrode configured to reflect a portion of light and transmit the remaining portion of the light. The second electrode 132 may include a metal layer having a relatively small thickness. For example, the second electrode 132 may include a mixed layer of silver (Ag) and magnesium (Mg) or a mixed layer of aluminum (Al) and lithium (Li), and the thickness of the second electrode 132 may be about 10 nm to about 20 nm. Since the thickness of the second electrode 132 is relatively small, light may partially pass through the second electrode 132.

The white organic light emitting layer 140 has a structure in which a red organic light emitting layer 141, a green organic light emitting layer 142, and a blue organic light emitting layer 143 are sequentially stacked between the first electrode 131 and the second electrode 132. Here, an exciton blocking layer 144 may be provided between the red organic light emitting layer 141 and the green organic light emitting layer 142, and an exciton blocking layer 145 may be provided between the green organic light emitting layer 142 and the blue organic light emitting layer 143.

A hole injection layer 151 may be provided between the first electrode 131 and the white organic light emitting layer 140. In addition, a hole transfer layer may be further provided between the hole injection layer 151 and the white organic light emitting layer 140. An electron injection layer 152 may be provided between the second electrode 132 and the white organic light emitting layer 140. In addition, an electron transfer layer may be further provided between the electron injection layer 152 and the white organic light emitting layer 140.

The light emitting device 100 may further include various additional layers. For example, an electron blocking layer may be further provided between the hole transfer layer and the white organic light emitting layer 140, and a hole blocking layer may be further provided between the electron transfer layer and the white organic light emitting layer 140.

According to the example embodiment, holes provided from the first electrode 131 through the hole injection layer 151 and electrons provided from the second electrode 132 through the electron injection layer 152 may be combined with each other in the red organic light emitting layer 141, the green organic light emitting layer 142, and the blue organic light emitting layer 143 such that the red organic light emitting layer 141, the green organic light emitting layer 142, and the blue organic light emitting layer 143 may respectively generate red light R, green light G, and blue light B.

The metal reflection layer 110 may be configured to form a microcavity L together with the second electrode 132. That is, the microcavity L may be formed between the metal reflection layer 110 and the second electrode 132. For example, light generated in the white organic light emitting layer 140 may resonate while reciprocating between the metal reflection layer 110 and the second electrode 132, and then light corresponding to the resonance wavelength of the microcavity L may be output through the second electrode 132.

The resonance wavelength of the microcavity L may be determined by the optical length of the microcavity L. For example, when the resonance wavelength of the microcavity L is denoted by λ, the optical length of the microcavity L may be nλ/2 (where n is a natural number). The optical length of the microcavity L may be determined by the sum of the optical thicknesses of the layers forming the microcavity L between the metal reflection layer 110 and the second electrode 132, a phase delay caused by the second electrode 132, and a phase shift, for example, a phase delay caused by the metal reflection layer 110. Here, the optical thicknesses of the layers forming the microcavity L are not simple physical thicknesses but are thicknesses considering the refractive indexes of the layers.

According to the example embodiment, the optical thicknesses of the layers forming the microcavity L and the phase delay caused by the second electrode 132 may be fixed, and the phase shift caused by the metal reflection layer 110 may be adjusted to adjust the optical length or resonance wavelength of the microcavity L.

The phase modulation surface is formed on a reflective surface of the metal reflection layer 110 to adjust the phase shift caused by the metal reflection layer 110. The phase modulation surface may have a meta structure in which nanopatterns 112 having a nano size are periodically arranged.

Figure 2:
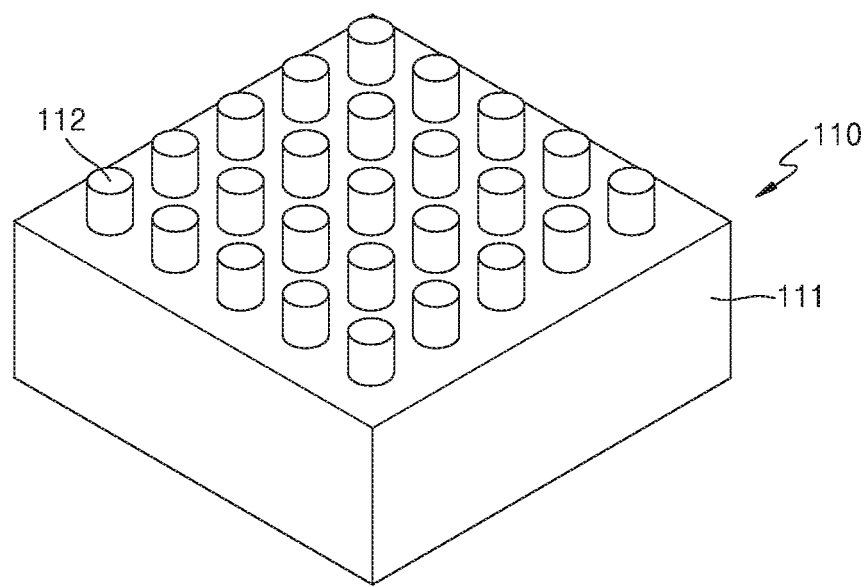
FIG. 2 is a perspective view illustrating a metal reflection layer shown in FIG. 1.
Figure 3:
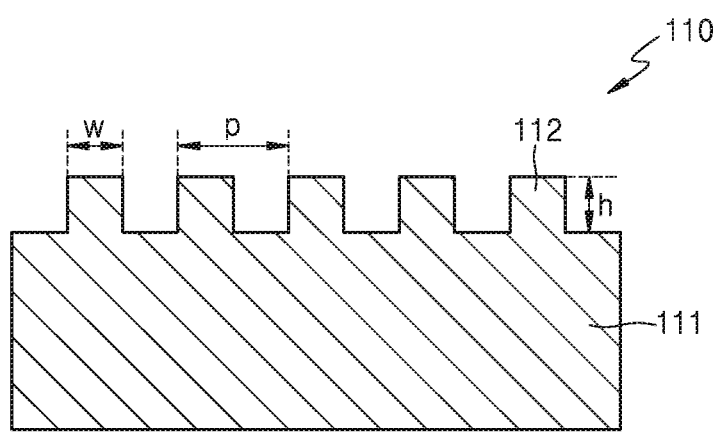
FIG. 3 is a cross-sectional view illustrating the metal reflection layer shown in FIG. 2.

FIG. 2 is a perspective view illustrating the metal reflection layer 110 shown in FIG. 1, and FIG. 3 is a cross-sectional view illustrating the metal reflection layer 110 shown in FIG. 2.

Referring to FIGS. 2 and 3, the metal reflection layer 110 may include a base portion 111 and the phase modulation surface formed on an upper surface of the base portion 111. The phase modulation surface includes the nanopatterns 112 that are periodically arranged on the upper surface of the base portion 111. Here, each of the nanopatterns 112 may have a post shape protruding from the upper surface of the base portion 111. For example, each of the nanopatterns 112 may have a cylindrical shape. The base portion 111 and the nanopatterns 112 may be formed in one piece. For example, the base portion 111 and the nanopatterns 112 may include at least one metallic material selected from silver (Ag), aluminum (Al), and gold (Au). However, embodiment are not limited thereto.

The optical characteristics of the phase modulation surface, for example, the phase delay of reflected light may be determined by the size, for example, the diameter (w) and height (h) of each of the nanopatterns 112, and the pitch (p) of the nanopatterns 112. Therefore, the resonance wavelength of the microcavity L may be determined by the diameter (w) and height (h) of each of the nanopatterns 112 of the phase modulation surface, and the pitch p of the nanopatterns 112. For example, when the resonance wavelength of the microcavity L is denoted by $\lambda$, the diameter (w) and height (h) of each of the nanopatterns 112 of the phase modulation surface and the pitch of the nanopatterns 112 may be selected such that the optical length of the microcavity L may be $n\lambda/2$ (where n is a natural number).

The microcavity L of the light emitting device 100 may have a resonance wavelength within a range of about 300 nm to about 700 nm. In this case, the diameter (w) of each of the nanopatterns 112 of the phase modulation surface may be within a range of about 50 nm to about 300 nm, and the height (h) of each of the nanopatterns 112 may be within a range of about 0 nm to about 150 nm. In addition, the pitch (p) of the nanopatterns 112 may be within a range of about 100 nm to about 400 nm. However, embodiments are not limited thereto. FIG. 1 illustrates an example in which the microcavity L is adjusted to have a green light G wavelength as a resonance wavelength such that the light emitting device 100 may emit green light G.

When the size of the nanopatterns 112 of the phase modulation surface is less than the resonance wavelength, incident light may resonate around the nanopatterns 112 and a plurality of nano light resonance structures may be formed. The electric field component of the incident light may not penetrate into spaces between the nanopatterns 112, and only the magnetic field component of the incident light may resonate around the nanopatterns 112. Thus, the plurality of nano light resonance structures formed in the spaces between the nanopatterns 112 may be configured to cause incident light to magnetically resonate as magnetic resonators.

Although FIGS. 2 and 3 illustrate an example in which each of the nanopatterns 112 has a cylindrical shape, each of the nanopatterns 112 may have any other shape. For example, the nanopatterns 112 may have an elliptical post shape.

Figure 4:
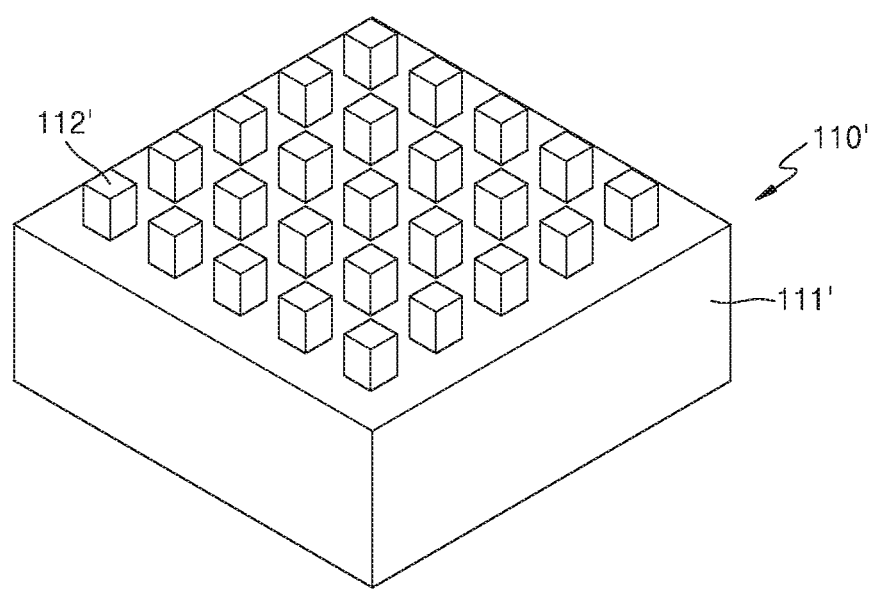
FIG. 4 is a view illustrating a modification example of the metal reflection layer applicable to the light emitting device shown in FIG. 1.

FIG. 4 is a view illustrating a modification example of the metal reflection layer 110 applicable to the light emitting device 100 shown in FIG. 1. Referring to FIG. 4, a metal reflection layer 110' includes a base portion 111' and a phase modulation surface formed on an upper surface of the base portion 111'. The phase modulation surface includes nanopatterns 112' that are periodically arranged on the upper surface of the base portion 111'. Here, each of the nanopatterns 112' may have a tetragonal post shape protruding from the upper surface of the base portion 111'.

In FIG. 4, the optical characteristics of the phase modulation surface, for example, the phase delay of reflected light may be determined by the size, for example, width and height of each of the nanopatterns 112', and the pitch of the nanopatterns 112'. In addition, although FIG. 4 illustrates an example in which each of the nanopatterns 112' has a tetragonal post shape, each of the nanopatterns 112' may have any other polyprism shape such as a triangular post shape or a pentagonal post shape.

Figure 5:
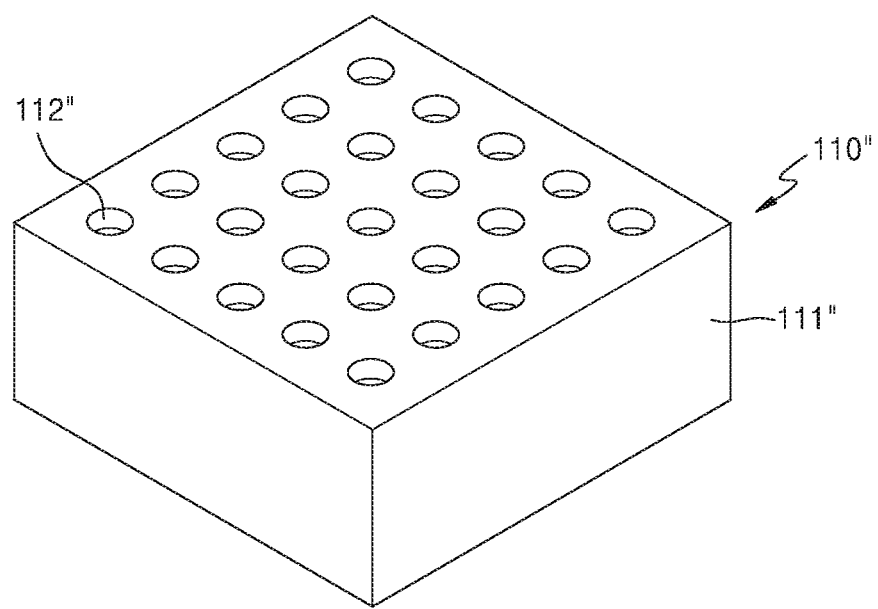
FIG. 5 is a view illustrating another modification example of the metal reflection layer applicable to the light emitting device shown in FIG. 1.

FIG. 5 is a view illustrating another modification example of the metal reflection layer 110 applicable to the light emitting device 100 shown in FIG. 1. Referring to FIG. 5, a metal reflection layer 110" includes a base portion 111" and a phase modulation surface formed on an upper surface of the base portion 111". The phase modulation surface includes nanopatterns 112" that are periodically arranged on the upper surface of the base portion 111". Here, each of the nanopatterns 112" may include a recess which is formed in a given shape in the upper surface of the base portion 111" to a given depth. Although FIG. 5 illustrates an example in which each of the recesses has a cylindrical shape, the recesses may have any other shape. In FIG. 5, the optical characteristics of the phase modulation surface, for example, the phase delay of reflected light may be determined by the diameter and depth of each of the nanopatterns 112" and the pitch of the nanopatterns 112".

Figure 6:
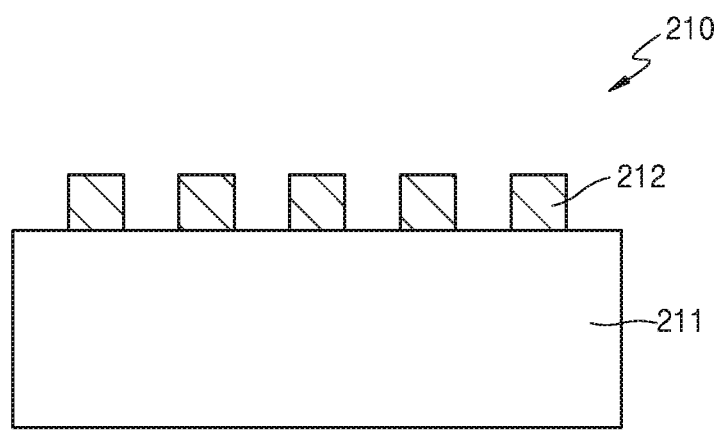
FIG. 6 is a view illustrating another modification example of the metal reflection layer applicable to the light emitting device shown in FIG. 1.

FIG. 6 is a view illustrating another modification example of the metal reflection layer 110 applicable to the light emitting device 100 shown in FIG. 1. Referring to FIG. 6, a metal reflection layer 210 includes a base portion 211 and a phase modulation surface formed on an upper surface of the base portion 211. The phase modulation surface includes nanopatterns 212 protruding from the upper surface of the base portion 211. Here, the nanopatterns 212 may be provided separately from the base portion 211. The base portion 211 may include various materials, and the nanopatterns 212 may include at least one metallic material selected from silver (Ag), aluminum (Al), and gold (Au).

Figure 7:
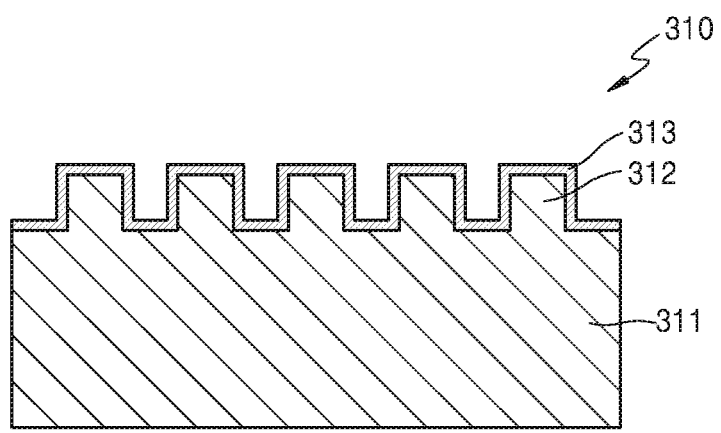
FIG. 7 is a view illustrating another modification example of the metal reflection layer applicable to the light emitting device shown in FIG. 1.

FIG. 7 is a view illustrating another modification example of the metal reflection layer 110 applicable to the light emitting device 100 shown in FIG. 1. Referring to FIG. 7, a metal reflection layer 310 includes a base portion 311 and a phase modulation surface formed on an upper surface of the base portion 311. The phase modulation surface includes nanopatterns provided on the upper surface of the base portion 311. Here, the nanopatterns may include nanostructures 312 protruding from the upper surface of the base portion 311, and a metal coating layer 313 formed to cover the surfaces of the nanostructures 312 and the upper surface of the base portion 311. The nanostructures 312 may be formed in one piece with or separately from the base portion 311. The base portion 311 and the nanostructures 312 may include various materials. For example, the metal coating layer 313 may include at least one metallic material selected from silver (Ag), aluminum (Al), and gold (Au).

Figure 8A:
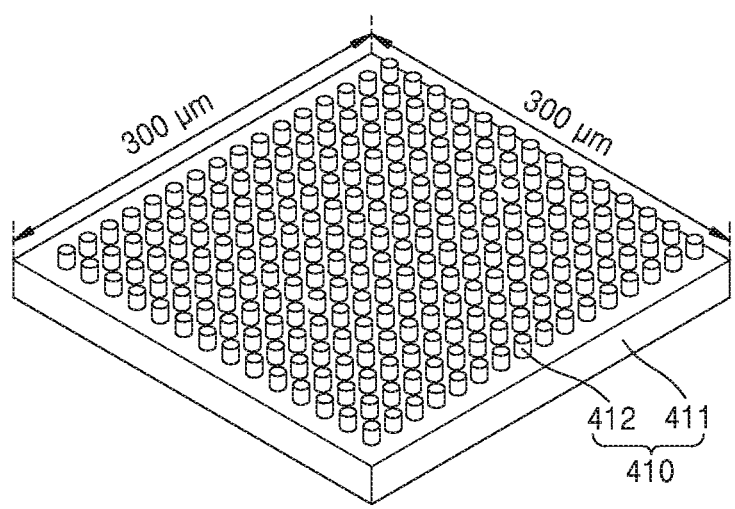
FIG. 8A is a view illustrating an experimental model of a metal reflection layer.

FIG. 8A is a view illustrating an experimental model of a metal reflection layer. FIG. 8A illustrates an Ag metal reflection layer 410 in which nanopatterns 412 having a cylindrical shape are arranged on an upper surface of a base portion 411. Here, the upper surface of the base portion 411 has an area of 300×300 $\mu m^2$, each of the nanopatterns 412 has a diameter of 100 nm and a height of 100 nm, and the nanopatterns 412 are periodically arranged at a pitch of 225 nm.

The Ag metal reflection layer 410 illustrated in FIG. 8A may be formed, for example, through a nano-transfer-printing process as described below. However, embodiments are not limited thereto, and the Ag metal reflection layer 410 may be formed by any other method.

To form the Ag metal reflection layer 410, first, electron beam (e-beam) resist is applied to an upper surface of a silicon wafer having an area of 300×300 μm$^2$, and nanohole patterns are formed in the e-beam resist through an e-beam lithography process. Here, each of the nanohole patterns has a diameter of 100 nm, and the nanohole patterns are periodically formed at a pitch of 225 nm.

Next, the silicon wafer is etched to a depth of 100 nm by using the nanohole patterns formed in the patterned e-beam resist. Here, the silicon wafer may be etched for about 10 seconds to about 20 seconds through a reactive ion etching (RIE) process, for example, under an SF6 gas atmosphere. Thereafter, a silicon master having nanohole patterns is completely manufactured by removing the e-beam resist from the upper surface of the silicon wafer.

Thereafter, a fluorine-based ultraviolet (UV) curable resin is applied to the silicon master, and then the silicon master is covered with a polyethylene terephthalate (PET) film. Next, an exposure process may be performed using a UV lamp to complete a polymerization reaction, and when the PET film is removed, reverse patterns of the nanohole patterns formed on the silicon master are transferred to a thin fluorine-based polymer film.

Next, a fluorine-based UV curable resin is applied to the thin fluorine-based polymer film on which the reverse patterns are formed, the thin fluorine-based polymer film is covered with a PET film, and a UV exposure process is performed to form a polymer mold on which the same nanohole patterns as those formed in the silicon master are formed. Then, the polymer mold on which the nanohole patterns are formed is placed in a vacuum deposition device, and a thin silver (Ag) film is deposited on the polymer mold by a thermal deposition method. Thereafter, the thin silver (Ag) film is separated from the polymer mold, and then, as shown in FIG. 8A, the Ag metal reflection layer 410, which includes the nanopatterns 412 having a cylindrical shape and protruding from the upper surface of base portion 411, may be completely manufactured.

Figure 8B:
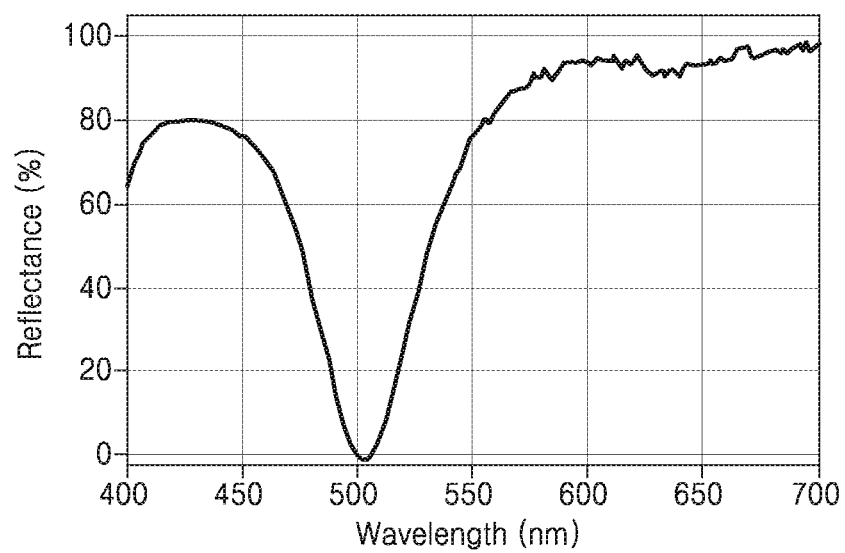
FIG. 8B is a graph illustrating the reflectance of the metal reflection layer shown in FIG. 8A.

FIG. 8B is a graph illustrating the reflectance of the Ag metal reflection layer 410 shown in FIG. 8A. FIG. 8B illustrates that the Ag metal reflection layer 410 has the characteristics of a meta mirror which has a large resonance effect at a wavelength of about 500 nm, which corresponds to the wavelength of green light, and a high degree of reflectance at a wavelength of about 600 nm, which corresponds to the wavelength of red light, and a wavelength of about 450 nm, which corresponds to the wavelength of blue light. Here, the degree or wavelength of optical resonance may be controlled by adjusting the shape, size, height, and pitch of the nanopatterns 412.

Referring back to FIG. 1, the color conversion layer 120 is provided between the phase modulation surface of the metal reflection layer 110 and the first electrode 131. Here, the color conversion layer 120 may include a dielectric 121 and a photoluminescent material 122 dispersed in the dielectric 121.

For uniform current density, the dielectric 121 may be configured to planarize the upper portion of the phase modulation surface having a meta structure. The dielectric 121 may cover the phase modulation surface of the metal reflection layer 110 such that the upper surface of the metal reflection layer 110 may be flat. The dielectric 121 may include an insulating material that is transparent to visible light. For example, the dielectric 121 may include, but is not limited to, a material such as silicon dioxide ($SiO_2$), silicon nitride ($SiN_x$), aluminum oxide ($Al_2O_3$), or hafnium (IV) oxide ($HfO_2$).

The photoluminescent material 122 may be configured to convert incident light into light having a given wavelength. For example, the photoluminescent material 122 may convert light having a relatively high energy level into light having a relatively low energy level. For example, the photoluminescent material 122 may convert blue light B into green light G, or may convert blue light B and green light G into red light R. FIG. 1 illustrates an example in which a green photoluminescent material that converts blue light B into green light G is used as the photoluminescent material 122.

The photoluminescent material 122 may include, for example, at least one selected from quantum dots, organic fluorescent dyes, organic fluorescent semiconductors, and organic phosphorescent semiconductors. Here, the quantum dots may include, for example, a group II-VI semiconductor material or a group III-V semiconductor material.

The color conversion layer 120 may be formed using an organic binder including the photoluminescent material 122. In this case, for example, the organic binder including the photoluminescent material 122 may be prepared by dissolving a polymer material in an organic solvent together with the photoluminescent material 122 or mixing a heat crosslinkable resin or a UV crosslinkable resin with the photoluminescent material 122. However, embodiments are not limited thereto.

In the case of a light emitting device having a structure in which only a planarization layer including a dielectric is formed on a phase modulation surface having a meta structure, a microcavity may output light having only a specific wavelength among red light, green light, and blue light generated in a white organic light emitting layer. Therefore, the efficiency of the light emitting device may be low due to the loss of light, which is not output to the outside.

However, in the light emitting device 100 of the example embodiment, as shown in FIG. 1, the microcavity L has the wavelength of green light G as a resonance wavelength, and a green photoluminescent material is used as the photoluminescent material 122, such that green light G generated in the green organic light emitting layer 142 may resonate while reciprocating between the metal reflection layer 110 and the second electrode 132, and may then be output to the outside through the second electrode 132. In addition, blue light B generated in the blue organic light emitting layer 143 may be converted into green light G by the photoluminescent material 122, and after the green light G resonates while reciprocating between the metal reflection layer 110 and the second electrode 132, the green light G may be output to the outside through the second electrode 132, thereby improving the efficiency of green light emission. In this case, red light R generated in the red organic light emitting layer 141 may remain inside the microcavity L without being converted into green light G.

When blue light B generated in the blue organic light emitting layer 143 is converted into surface plasmons in the meta structure of the phase modulation surface, the surface plasmons may increase the efficiency of conversion into green light G which occurs in the photoluminescent material 122 which is a green photoluminescent material of the color conversion layer 120. Since surface plasmons concentrate optical energy in small volumes on a metal surface having a meta structure, and thus markedly increase the intensity of light, surface plasmons may improve the efficiency of light conversion. In addition, when the intensity of an electric field increases around the meta structure and the photoluminescent material 122 is placed in the electric field, the efficiency of light conversion may be further improved by the Purcell effect.

As described above, in the light emitting device 100 of the example embodiment, the color conversion layer 120 including the photoluminescent material 122 is provided on the phase modulation surface having a meta structure, and thus the efficiency of light emission may be markedly improved.

Figure 9A:
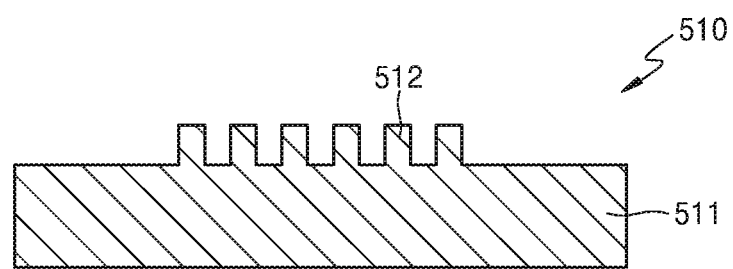
FIG. 9A is a view illustrating another experimental model of a metal reflection layer.

FIG. 9A is a view illustrating another experimental model of a metal reflection layer. FIG. 9A illustrates an Ag metal reflection layer 510 having nanopatterns 512 on an upper surface of a base portion 511. Here, the Ag metal reflection layer 510 includes a central portion on which the nanopatterns 512 having a cylindrical shape are arranged, and a flat outer portion around the nanopatterns 512. The central portion on which the nanopatterns 512 are provided may have an area of 300×300 $\mu m^2$, each of the nanopatterns 512 may have a diameter of 100 nm and a height of 100 nm, and the nanopatterns 512 may be periodically arranged at a pitch of 225 nm.

Figure 9B:
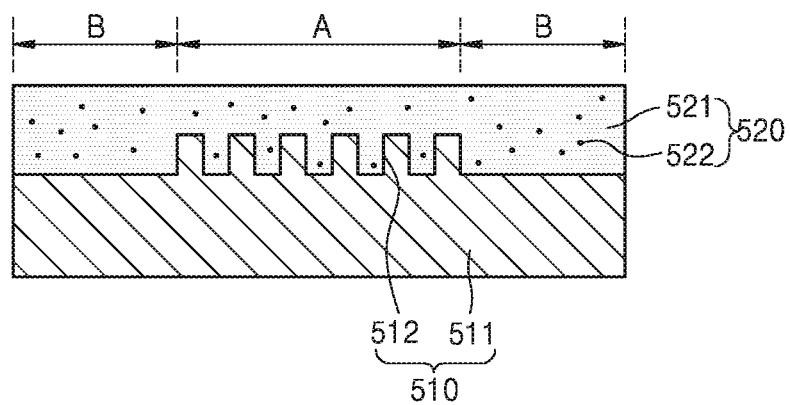
FIG. 9B is a view illustrating a color conversion layer that covers an upper surface of the metal reflection layer shown in FIG. 9A.

FIG. 9B is a view illustrating a color conversion layer 520 that covers an upper surface of the Ag metal reflection layer 510 shown in FIG. 9A. The color conversion layer 520 shown in FIG. 9B may be formed by spin coating the upper surface of the Ag metal reflection layer 510 with a solution in which polymethyl methacrylate (PMMA) 521, which is a dielectric, and rhodamine 6G 522, which is an organic fluorescent dye, are dissolved in chlorobenzene, which is an organic solvent.

The light emission characteristics of the structure shown in FIG. 9B were measured using a dark field image, and results of the measurement showed relatively strong light emission in a meta structure region A in which the nanopatterns 512 were formed and relatively weak light emission in a flat region B in which the nanopatterns 512 were not formed. Accordingly, light emission characteristics may be more improved when a photoluminescent material is provided above a metal surface having a meta structure than when a photoluminescent material is provided above a flat metal surface.

Figure 10:
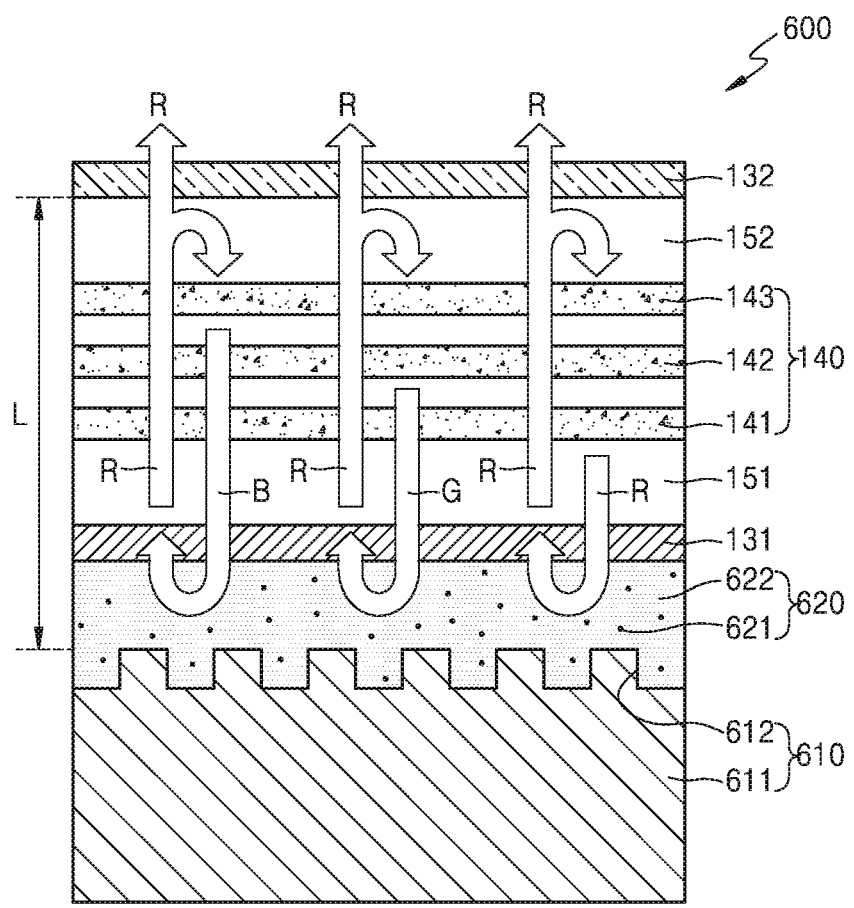
FIG. 10 is a view illustrating a light emitting device according to another example embodiment.

FIG. 10 is a view illustrating a light emitting device 600 according to another example embodiment. The light emitting device 600 shown in FIG. 10 is the same as the light emitting device 100 shown in FIG. 1 except that the light emitting device 600 outputs red light R.

Referring to FIG. 10, a metal reflection layer 610 may form a microcavity L together with a second electrode 132, and a phase modification surface for phase shift adjustment is formed on a reflective surface of the metal reflection layer 610. The phase modulation surface may have a meta structure in which nanopatterns 612 are periodically arranged on an upper surface of a base portion 611. In the example embodiment, the microcavity L may be adjusted to have the wavelength of red light R as a resonance wavelength. In addition, the metal reflection layer 610 shown in FIG. 10 may encompass the metal reflection layers 110, 110', 110", 210, and 310 described with reference to FIGS. 2 to 7.

A color conversion layer 620 is provided on the phase modulation surface of the metal reflection layer 610. The color conversion layer 620 may include a dielectric 621 and a photoluminescent material 622 dispersed in the dielectric 621. In the example embodiment, a red photoluminescent material configured to convert blue light B and green light G into red light R may be used as the photoluminescent material 622.

In the light emitting device 600 illustrated in FIG. 10, red light R generated in a red organic light emitting layer 141 may resonate while reciprocating between the metal reflection layer 610 and the second electrode 132, and may then be output to the outside through the second electrode 132. In addition, blue light B generated in a blue organic light emitting layer 143 may be converted into red light R by the photoluminescent material 622, and after the red light R resonates while reciprocating between the metal reflection layer 610 and the second electrode 132, the red light R may be output to the outside through the second electrode 132. In addition, green light G generated in a green organic light emitting layer 142 may be converted into red light R by the photoluminescent material 622, and after the red light R resonates while reciprocating between the metal reflection layer 610 and the second electrode 132, the red light R may be output to the outside through the second electrode 132, thereby improving the efficiency of red light emission.

As described above, in the light emitting device 600 illustrated in FIG. 10, the photoluminescent material 622 is provided above the phase modulation surface of the metal reflection layer 610, and thus incident light may be converted into light having a desired wavelength, and may then be output, thereby improving the efficiency of light emission. In addition, since the phase modulation surface of the metal reflection layer 610 has the meta structure and the photoluminescent material 622 is provided above the meta structure, the efficiency of light emission may be further improved.

Figure 11:
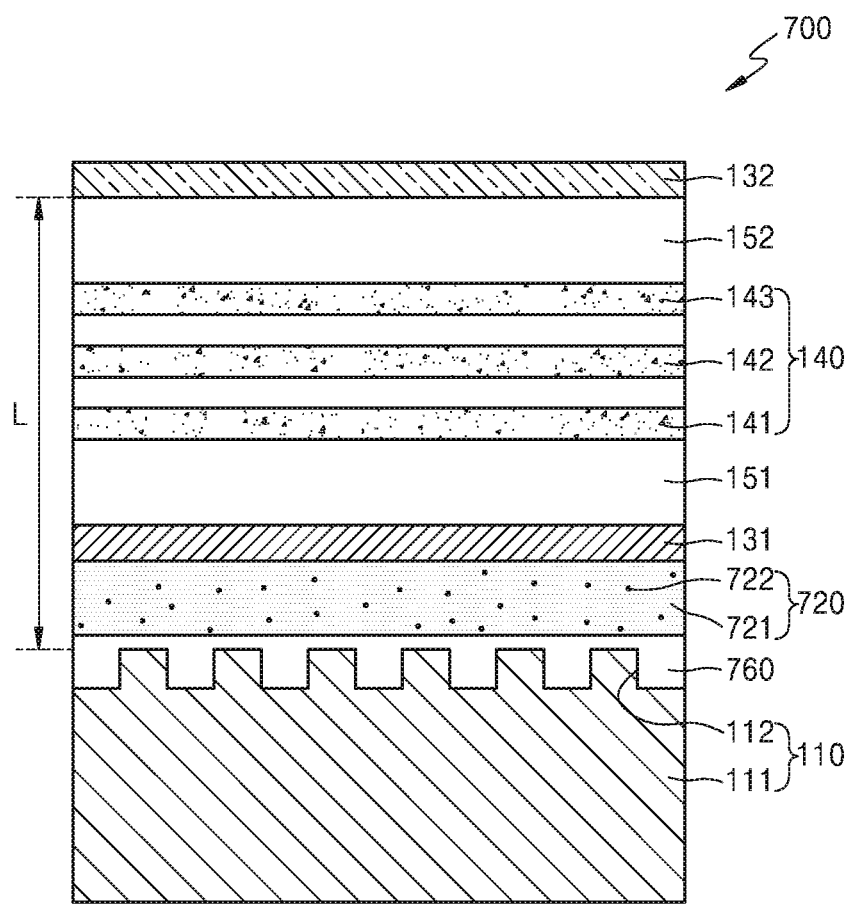
FIG. 11 is a view illustrating a light emitting device according to another example embodiment.

FIG. 11 is a view illustrating a light emitting device 700 according to another example embodiment. The light emitting device 700 illustrated in FIG. 11 is the same as the light emitting device 100 illustrated in FIG. 1 except that a planarization layer 760, which is transparent, is provided between a metal reflection layer 110 and a color conversion layer 720.

Referring to FIG. 11, the planarization layer 760, which is transparent, is provided on a phase modulation surface of the metal reflection layer 110, and the color conversion layer 720 is provided on the planarization layer 760. Here, the planarization layer 760 may be configured to planarize an upper portion of the phase modulation surface having a meta structure to obtain uniform current density. To this end, the planarization layer 760 may cover the phase modulation surface of the metal reflection layer 110 such that the upper surface of the metal reflection layer 110 may be flat. The planarization layer 760 may include an insulating material that is transparent to visible light. For example, the planarization layer 760 may include, but is not limited to, a material such as $SiO_2$, $SiN_x$, $Al_2O_3$, or $HfO_2$.

The color conversion layer 720 is provided on an upper surface of the planarization layer 760. The color conversion layer 720 may include a dielectric 721 and a photoluminescent material 722 dispersed in the dielectric 721. The dielectric 721 may include an insulating material that is transparent to visible light. The dielectric 721 may include the same material as the planarization layer 760, but is not limited thereto.

The photoluminescent material 722 may be configured to convert incident light into light having a given wavelength. For example, the photoluminescent material 722 may convert light having a relatively high energy level into light having a relatively low energy level. The photoluminescent material 722 may include, for example, at least one selected from quantum dots, organic fluorescent dyes, organic fluorescent semiconductors, and organic phosphorescent semiconductors. The color conversion layer 720 may be formed using an organic binder including the photoluminescent material 722.

Figure 12:
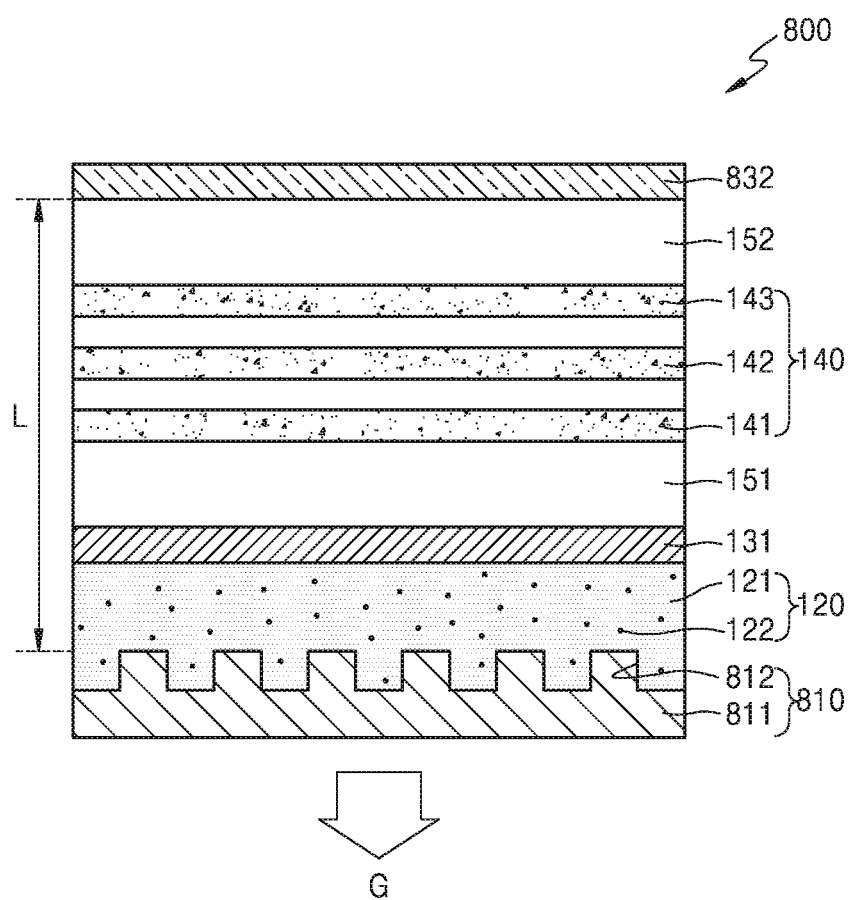
FIG. 12 is a view illustrating a light emitting device according to another example embodiment.

FIG. 12 is a view illustrating a light emitting device 800 according to another example embodiment. The light emitting device 800 illustrated in FIG. 12 is the same as the light emitting device 100 illustrated in FIG. 1 except that a metal reflection layer 810 is translucent and a second electrode 832 is a reflective electrode.

Referring to FIG. 12, a first electrode 131 provided below a white organic light emitting layer 140 may include a transparent electrode, and the second electrode 832 provided above the white organic light emitting layer 140 may include a reflective electrode that reflects incident light. In addition, the metal reflection layer 810 provided below the first electrode 131 may include a translucent layer configured to transmit a portion of incident light and reflects the remaining portion of the incident light.

The metal reflection layer 810 may form a microcavity L together with the second electrode 832, and a phase modulation surface for phase shift adjustment is formed on a reflective surface of the metal reflection layer 810. Here, the phase modulation surface of the metal reflection layer 810 may have a meta structure in which nanopatterns 812 are periodically arranged on an upper surface of a base portion 811. FIG. 12 illustrates an example in which the microcavity L is adjusted to have the wavelength of green light G as a resonance wavelength.

A color conversion layer 120 is provided between the phase modulation surface of the metal reflection layer 810 and the first electrode 131. Here, the color conversion layer 120 may include a dielectric 121 and a photoluminescent material 122 dispersed in the dielectric 121. FIG. 12 illustrates an example in which a green photoluminescent material configured to convert blue light B into green light G is used as the photoluminescent material 122.

In the light emitting device 800 illustrated in FIG. 12, green light G generated in a green organic light emitting layer 142 may resonate while reciprocating between the metal reflection layer 810 and the second electrode 832, and may then be output to the outside through the metal reflection layer 810, which is translucent. In addition, blue light B generated in a blue organic light emitting layer 143 may be converted into green light G by the photoluminescent material 122, and after the green light G resonates while reciprocating between the metal reflection layer 810 and the second electrode 832, the green light G may be output to the outside through the metal reflection layer 810.

Figure 13:
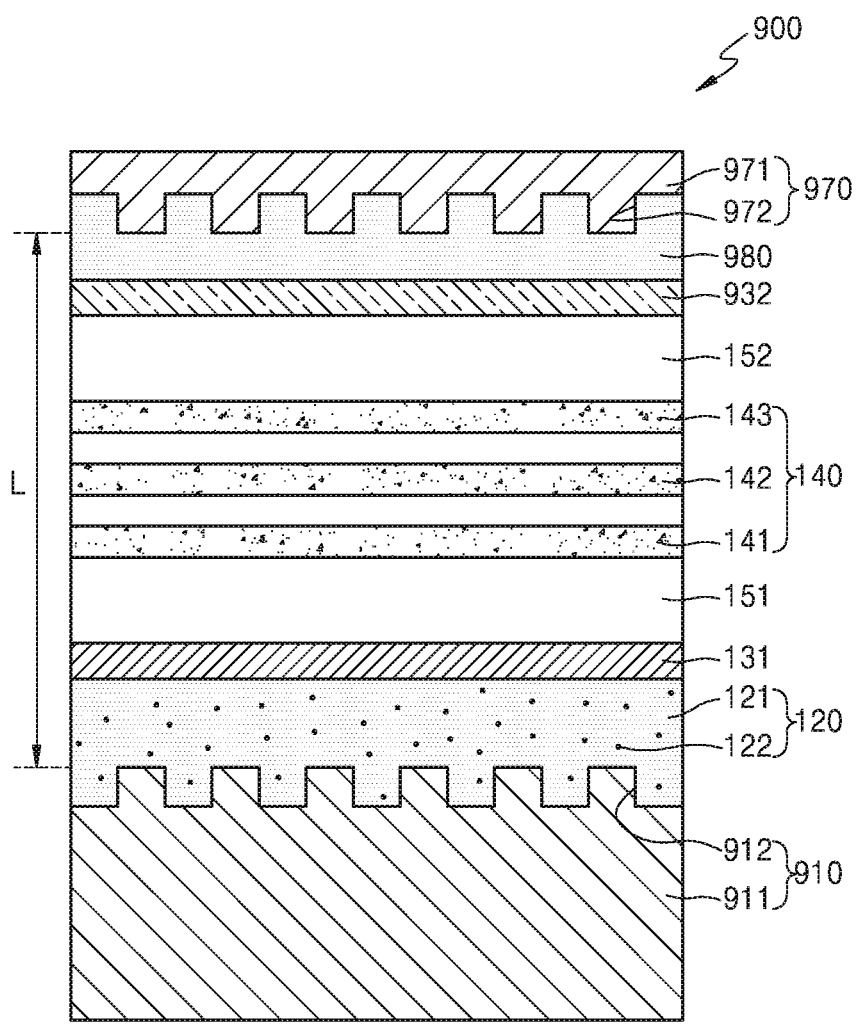
FIG. 13 is a view illustrating a light emitting device according to another example embodiment.

FIG. 13 is a view illustrating a light emitting device 900 according to another example embodiment.

Referring to FIG. 13, the light emitting device 900 includes a first metal reflection layer 910 having a first phase modulation surface, a color conversion layer 120; a first electrode 131, a white organic light emitting layer 140, a second electrode 932, a planarization layer 980, and a second metal reflection layer 970 having a second phase modulation surface. Here, the first and second metal reflection layers 910 and 970 may form a microcavity L.

The first phase modulation surface of the first metal reflection layer 910 may have a meta structure in which first nanopatterns 912 are periodically arranged on an upper surface of a first base portion 911, and the second phase modulation surface of the second metal reflection layer 970 may have a meta structure in which second nanopatterns 972 are periodically arranged on a lower surface of a second base portion 971. Here, the shapes, sizes and pitches of the first nanopatterns 912 and the second nanopatterns 972 may be adjusted such that the microcavity L formed by the first metal reflection layer 910 and the second metal reflection layer 970 may have a given resonance wavelength.

One of the first metal reflection layer 910 and the second metal reflection layer 970 may be reflective, and the other of the first metal reflection layer 910 and the second metal reflection layer 970 may be translucent and configured to transmit a portion of light and reflect the remaining portion of the light. FIG. 13 illustrates an example in which the first metal reflection layer 910 is a reflective layer and the second metal reflection layer 970 is a translucent layer. In addition, the first electrode 131 and the second electrode 932 may include transparent electrodes.

The color conversion layer 120 is provided between the first metal reflection layer 910 and the first electrode 131. Here, the color conversion layer 120 may include a dielectric 121 and a photoluminescent material 122 dispersed in the dielectric 121. A planarization layer 980, which is transparent, is provided between the second metal reflection layer 970 and the second electrode 932. Here, the planarization layer 980 may be configured to planarize a lower portion of the second phase modulation surface having a meta structure to obtain uniform current density. To this end, the planarization layer 980 may cover the second phase modulation surface of the second metal reflection layer 970 such that a lower surface of the second metal reflection layer 970 may be flat. The planarization layer 980 may include an insulating material that is transparent to visible light. In addition, the photoluminescent material 122 included in the color conversion layer 120 may be further provided in the planarization layer 980.

In the light emitting device 900 illustrated in FIG. 13, light generated in the white organic light emitting layer 140 may be converted into light having a given wavelength by the photoluminescent material 122 in the color conversion layer 120, and after the light resonates while reciprocating between the first metal reflection layer 910 and the second metal reflection layer 970, the light may be output to the outside through the second metal reflection layer 970, which is translucent.

As described above, according to the one or more of the above example embodiments, the photoluminescent material is provided above the phase modulation surface of the metal reflection layer, and thus, incident light may be converted into light having a desired wavelength, and may then be output, thereby improving the efficiency of light emission. In addition, the meta structure is formed on the phase modulation surface of the metal reflection layer, and the photoluminescent material is provided above the meta structure such that the efficiency of light emission may be further improved.

FIG. 14 is a view illustrating a display apparatus 1000 according to an example embodiment.

Referring to FIG. 14, the display apparatus 1000 includes a plurality of pixels that emit light having different colors. Here, the plurality of pixels may include red pixel 1300, a green pixel 1200, and a blue pixel 1100 that are adjacent to each other and arranged on the same surface of a substrate. In FIG. 14, one unit pixel including the red pixel 1300, the green pixel 1200, and the blue pixel 1100 is illustrated. In the display apparatus 1000 illustrated in FIG. 14, each of the red pixel 1300 and the green pixel 1200 may have the same structure as the light emitting device 100 illustrated in FIG. 1.

The red pixel 1300 includes a first metal reflection layer 1310 including a first phase modulation surface, a first color conversion layer 1320 provided on the first phase modulation surface and including a first photoluminescent material 1322, a first electrode 1131 provided on the first color conversion layer 1320, a white organic light emitting layer 1140 provided above the first electrode 1131, and a second electrode 1132 provided above the white organic light emitting layer 1140.

The first electrode 1131 may include a transparent electrode that transmits light, and the second electrode 1132 may include a translucent electrode that reflects a portion of light and transmits the remaining portion of the light. The white organic light emitting layer 1140 has a structure in which a red organic light emitting layer 1141, a green organic light emitting layer 1142, and a blue organic light emitting layer 1143 are sequentially stacked between the first electrode 1131 and the second electrode 1132.

A hole injection layer 1151 may be provided between the first electrode 1131 and the white organic light emitting layer 1140, and an electron injection layer 1152 may be provided between the second electrode 1132 and the white organic light emitting layer 1140. A hole transfer layer may be further provided between the hole injection layer 1151 and the white organic light emitting layer 1140, and an electron transfer layer may be further provided between the electron injection layer 1152 and the white organic light emitting layer 1140.

The first metal reflection layer 1310 may form a first microcavity together with the second electrode 1132. The first metal reflection layer 1310 may include, for example, at least one metallic material selected from Ag, Al, and Au, but is not limited thereto.

A phase shift caused by the first metal reflection layer 1310 may be adjusted such that the first microcavity may have the wavelength of red light R as a resonance wavelength. To this end, the first phase modulation surface is formed on a reflective surface of the first metal reflection layer 1310. The first metal reflection layer 1310 may have the structure shown in FIGS. 2 and 3. For example, the first phase modulation surface may have a meta structure in which cylindrical nanopatterns 1312 protruding from an upper surface of a base portion 1311 are periodically arranged. However, embodiments are not limited thereto, and the first metal reflection layer 1310 may have any of the structures shown in FIGS. 4 to 7.

The first color conversion layer 1320 covers the first phase modulation surface of the first metal reflection layer 1310. The first color conversion layer 1320 may include a dielectric 1321 and the first photoluminescent material 1322 dispersed in the dielectric 1321. The dielectric 1321 may include an insulating material that is transparent to visible light. In addition, the first photoluminescent material 1322 may include a red photoluminescent material that converts blue light B and green light G into red light R. The first photoluminescent material 1322 may include, for example, at least one selected from quantum dots, organic fluorescent dyes, organic fluorescent semiconductors, and organic phosphorescent semiconductors.

The green pixel 1200 includes a second metal reflection layer 1210 including a second phase modulation surface, a second color conversion layer 1220 provided on the second phase modulation surface and including a second photoluminescent material 1222, the first electrode 1131 provided on the second color conversion layer 1220, the white organic light emitting layer 1140 provided above the first electrode 1131, and the second electrode 1132 provided above the white organic light emitting layer 1140. Since the first electrode 1131 and the second electrode 1132 and the white organic light emitting layer 1140 have been described above, descriptions thereof are omitted.

The second metal reflection layer 1210 may form a second microcavity together with the second electrode 1132. Similar to the first metal reflection layer 1310, the second metal reflection layer 1210 may include, for example, at least one metallic material selected from Ag, Al, and Au, but is not limited thereto.

A phase shift caused by the second metal reflection layer 1210 may be adjusted such that the second microcavity may have the wavelength of green light G as a resonance wavelength. To this end, the second phase modulation surface is formed on a reflective surface of the second metal reflection layer 1210. The second metal reflection layer 1210 may have the structure shown in FIGS. 2 and 3. For example, the second phase modulation surface may have a meta structure in which cylindrical nanopatterns 1212 protruding from an upper surface of a base portion 1211 are periodically arranged. However, this is merely an example, and the second metal reflection layer 1210 may have any of the structures shown in FIGS. 4 to 7.

The second color conversion layer 1220 covers the second phase modulation surface of the second metal reflection layer 1210. The second color conversion layer 1220 may include a dielectric 1221 and the second photoluminescent material 1222 dispersed in the dielectric 1221. Here, the second photoluminescent material 1222 may include a green photoluminescent material that converts blue light B into green light G. Similar to the first photoluminescent material 1322, the second photoluminescent material 1222 may include, for example, at least one selected from quantum dots, organic fluorescent dyes, organic fluorescent semiconductors, and organic phosphorescent semiconductors.

The blue pixel 1100 includes: a third metal reflection layer 1110; a dielectric layer 1120 provided on the third metal reflection layer 1110; the first electrode 1131 provided on the dielectric layer 1120; the white organic light emitting layer 1140 provided above the first electrode 1131; and the second electrode 1132 provided above the white organic light emitting layer 1140. Since the first and second electrodes 1131 and 1132 and the white organic light emitting layer 1140 have been described above, descriptions thereof are omitted.

The third metal reflection layer 1110 may form a third microcavity together with the second electrode 1132. Like the first and second metal reflection layers 1310 and 1210, the third metal reflection layer 1110 may include, for example, at least one metallic material selected from Ag, Al, and Au, but is not limited thereto. The structural and optical characteristics of layers forming the third microcavity may be adjusted such that the third microcavity may have the wavelength of blue light B as a resonance wavelength.

The dielectric layer 1120 covers an upper surface of the third metal reflection layer 1110. The dielectric layer 1120 may include an insulating material that is transparent to visible light. The dielectric layer 1120 may include the same material as the dielectric 1321 of the first conversion layer 1320 and dielectric 1221 of the second color conversion layer 1220. However, embodiments are not limited thereto.

In the display apparatus 1000 having the above-described structure, the red pixel 1300 may output, through the second electrode 1132, red light R, which is generated in the red organic light emitting layer 1141 and resonates while reciprocating between the first metal reflection layer 1310 and the second electrode 1132. In addition, blue light B generated in the blue organic light emitting layer 1143 may be converted into red light R by the first photoluminescent material 1322, and after the red light R resonates while reciprocating between the first metal reflection layer 1310 and the second electrode 1132, the red light R may be output from the red pixel 1300 to the outside through the second electrode 1132. In addition, green light G generated in the green organic light emitting layer 1142 may be converted into red light R by the first photoluminescent material 1322, and after the red light R resonates while reciprocating between the first metal reflection layer 1310 and the second electrode 1132, the red light R may be output from the red pixel 1300 to the outside through the second electrode 1132.

The green pixel 1200 may output, through the second electrode 1132, green light G, which is generated in the green organic light emitting layer 1142 and resonates while reciprocating between the second metal reflection layer 1210 and the second electrode 1132. In addition, blue light B generated in the blue organic light emitting layer 1143 may be converted into green light G by the second photoluminescent material 1222, and after the green light G resonates while reciprocating between the second metal reflection layer 1210 and the second electrode 1132, the green light G may be output from the green pixel 1200 to the outside through the second electrode 1132.

The blue pixel 1100 may output, through the second electrode 1132, blue light B, which is generated in the blue organic light emitting layer 1143 and resonates while reciprocating between the third metal reflection layer 1110 and the second electrode 1132.

It has been described that the red pixel 1300 and the green pixel 1200 of the display apparatus 1000 illustrated in FIG. 14 have the same structure as the light emitting device 100 illustrated in FIG. 1. However, embodiments are not limited thereto. For example, the red pixel 1300 and the green pixel 1200 may have the same structure as any of the light emitting devices 700, 800, and 900 illustrated in FIGS. 11 to 13. In addition, it has been described that the red pixel 1300 and the green pixel 1200 of the display apparatus 1000 illustrated in FIG. 14 have phase modulation surfaces but the blue pixel 1100 of the display apparatus 1000 does not have a phase modulation surface. However, the embodiments are not limited thereto. For example, any two of the red pixel 1300, the green pixel 1200, and the blue pixel 1100 may have phase modulation surfaces, and the remaining pixel may not have a phase modulation surface. In another example, all of the red pixel 1300, the green pixel 1200, and the blue pixel 1100 may have phase modulation surfaces.

As described above, according to the one or more of the above example embodiments, the photoluminescent material is provided above the phase modulation surface of the metal reflection layer, and thus, incident light may be converted into light having a desired wavelength, and may then be output, thereby improving the efficiency of light emission. In addition, the meta structure is formed on the phase modulation surface of the metal reflection layer, and the photoluminescent material is provided above the meta structure such that the efficiency of light emission may be further improved.

It should be understood that example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A light emitting device comprising:
   a first metal reflection layer comprising a phase modulation surface configured to magnetically resonate light incident on the first metal reflection layer;
   a color conversion layer provided on the phase modulation surface of the first metal reflection layer and comprising a photoluminescent material;
   a first electrode provided on the color conversion layer opposite to the first metal reflection layer;
   a white organic light emitting layer provided on the first electrode opposite to the color conversion layer; and
   a second electrode provided on the white organic light emitting layer opposite to the first electrode,
   wherein the white organic light emitting layer includes a red organic light-emitting layer, a green organic light-emitting layer, and a blue organic light emitting layer.

2. The light emitting device of claim 1, wherein the first metal reflection layer and the second electrode form a microcavity having a resonance wavelength.

3. The light emitting device of claim 1, wherein the phase modulation surface comprises a meta structure in which nanopatterns are periodically provided.

4. The light emitting device of claim 1, wherein the color conversion layer further comprises a dielectric, the photoluminescent material being dispersed in the dielectric.

5. The light emitting device of claim 1, wherein the photoluminescent material comprises a green photoluminescent material configured to convert blue light into green light or a red photoluminescent material configured to convert blue light and green light respectively into red light.

6. The light emitting device of claim 1, wherein the color conversion layer covers the phase modulation surface of the first metal reflection layer.

7. The light emitting device of claim 1, further comprising:
   a transparent planarization layer provided between the first metal reflection layer and the color conversion layer and covering the phase modulation surface of the first metal reflection layer.

8. The light emitting device of claim 1, wherein the first electrode comprises a transparent electrode, and the second electrode comprises a translucent electrode configured to transmit a portion of light incident on the second electrode and reflect a remaining portion of the light incident on the second electrode.

9. The light emitting device of claim 1, wherein the first electrode comprises a transparent electrode and the second electrode comprises a reflective electrode, and
   wherein the first metal reflection layer is a translucent layer configured to transmit a portion of the light incident on the first metal reflection layer and reflect a remaining portion of the light incident on the first metal reflection layer.

10. The light emitting device of claim 1, further comprising:
    a second metal reflection layer provided on the second electrode and comprising a phase modulation surface; and a planarization layer provided between the second electrode and the second metal reflection layer and covering the phase modulation surface of the second metal reflection layer.

11. The light emitting device of claim 10, wherein the first metal reflection layer and the second metal reflection layer form a microcavity having a resonance wavelength.

12. The light emitting device of claim 10, wherein the first electrode and the second electrode respectively comprise a transparent electrode, and
wherein one of the first metal reflection layer and the second metal reflection layer is configured to reflect light, and the other of the first reflection layer and the second metal reflection layer is translucent and configured to transmit a portion of light and reflect a remaining portion of the light.

13. A display apparatus comprising:
a plurality of pixels configured to emit light having a plurality of colors,
wherein at least one of the plurality of pixels comprises:
a first metal reflection layer comprising a phase modulation surface configured to magnetically resonate light incident on the first metal reflection layer;
a color conversion layer provided on the phase modulation surface of the first metal reflection layer and comprising a photoluminescent material;
a first electrode provided on the color conversion layer opposite to the first metal reflection layer;
a white organic light emitting layer provided on the first electrode opposite to the color conversion layer; and
a second electrode provided on the white organic light emitting layer opposite to the first electrode,
wherein the white organic light emitting layer includes a red organic light-emitting layer, a green organic light-emitting layer, and a blue organic light emitting layer.

14. The display apparatus of claim 13, wherein the phase modulation surface comprises a meta structure in which nanopatterns are periodically provided.

15. The display apparatus of claim 13, wherein the color conversion layer further comprises a dielectric, the photoluminescent material being dispersed in the dielectric.

16. The display apparatus of claim 13, wherein the color conversion layer covers the phase modulation surface of the first metal reflection layer.

17. The display apparatus of claim 13, wherein the at least one of the plurality of pixels further comprises a transparent planarization layer provided between the first metal reflection layer and the color conversion layer and covering the phase modulation surface of the first metal reflection layer.

18. The display apparatus of claim 13, wherein the at least one of the plurality of pixels further comprises:
a second metal reflection layer provided on the second electrode and comprising a phase modulation surface; and
a planarization layer provided between the second electrode and the second metal reflection layer and covering the phase modulation surface of the second metal reflection layer.

19. The display apparatus of claim 13, wherein the plurality of pixels comprise a blue pixel, a green pixel, and a red pixel.

20. The display apparatus of claim 19, wherein a photoluminescent material included in the green pixel comprises a green photoluminescent material configured to convert blue light into green light, and a photoluminescent material included in the red pixel comprises a red photoluminescent material configured to convert blue light and green light respectively into red light.

21. A light emitting device comprising:
a first electrode;
a second electrode;
a light emitting layer provided between the first electrode and the second electrode, and configured to emit white light;
a metal reflection layer provided on the first electrode opposite to the light emitting layer, the metal reflection layer comprising a phase modulation surface configured to resonate a specific wavelength of the white light emitted from the light emitting layer; and
a color conversion layer provided between the first electrode and the metal reflection layer, and configured to convert a portion of the white light into light having the specific wavelength,
wherein the light emitting layer includes a red organic light-emitting layer, a green organic light-emitting layer, and a blue organic light emitting layer.

22. The light emitting device of claim 21, wherein the metal reflection layer comprises at least one of silver (Ag), aluminum (Al), and gold (Au).

23. The light emitting device of claim 21, wherein the phase modulation surface comprises a meta structure in which nanopatterns are periodically provided.

24. The light emitting device of claim 23, wherein each of the nanopatterns has a cylinder shape or polyprism shape.

25. The light emitting device of claim 23, wherein each of the nanopatterns has a width of 50 nm to 300 nm.

26. The light emitting device of claim 23, wherein the nanopatterns are provided at a pitch of 100 nm to 400 nm, the pitch being a distance between adjacent nanopatterns.

27. The light emitting device of claim 21, wherein the color conversion layer comprises a dielectric, a photoluminescent material being dispersed in the dielectric.

28. The light emitting device of claim 27, wherein the photoluminescent material comprises at least one of quantum dots, organic fluorescent dyes, organic fluorescent semiconductors, and organic phosphorescent semiconductors.

29. The light emitting device of claim 27, wherein the photoluminescent material comprises a green photoluminescent material configured to convert blue light into green light or a red photoluminescent material configured to convert blue light and green light respectively into red light.

30. The light emitting device of claim 21, wherein the color conversion layer covers the phase modulation surface of the metal reflection layer.

31. The light emitting device of claim 21, further comprising:
a transparent planarization layer provided between the metal reflection layer and the color conversion layer and covering the phase modulation surface of the metal reflection layer.

32. The light emitting device of claim 21, wherein the first electrode is a transparent electrode, and the second electrode is a translucent electrode configured to transmit a portion of light incident on the second electrode and reflect a remaining portion of the light incident on the second electrode.

33. The light emitting device of claim 21, wherein the first electrode is a transparent electrode and the second electrode is a reflective electrode, and
wherein the metal reflection layer is a translucent layer configured to transmit a portion of light incident on the metal reflection layer and reflect a remaining portion of the light incident on the metal reflection layer.

34. A light emitting device comprising:
a metal reflection layer comprising a phase modulation surface configured to magnetically resonate incident light, the phase modulation surface comprising a plurality of nanopatterns;
a color conversion layer provided on the phase modulation surface of the first metal reflection layer, the color conversion layer comprising a dielectric and a photoluminescent material;
a first electrode provided on the color conversion layer opposite to the first metal reflection layer;
a white organic light emitting layer provided on the first electrode opposite to the color conversion layer; and
a second electrode provided on the white organic light emitting layer opposite to the first electrode,
wherein the white organic light emitting layer includes a red organic light-emitting layer, a green organic light-emitting layer, and a blue organic light emitting layer.

35. The light emitting device of claim 34, wherein the color conversion layer covers the phase modulation surface of the metal reflection layer.

\* \* \* \* \*